(12) United States Patent
Fan et al.

(10) Patent No.: US 11,832,481 B2
(45) Date of Patent: Nov. 28, 2023

(54) DISPLAY PANEL AND DISPLAY DEVICE INCLUDING ADHESIVE THROUGH HOLE CONNECTING CATHODE AND PIXEL DEFINING BLOCK

(71) Applicant: Wuhan China Star Optoelectronics Semiconductor Display Technology Co., Ltd., Wuhan (CN)

(72) Inventors: Congcong Fan, Wuhan (CN); Shengfang Liu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/979,878

(22) PCT Filed: Jun. 18, 2020

(86) PCT No.: PCT/CN2020/096699
§ 371 (c)(1),
(2) Date: Sep. 11, 2020

(87) PCT Pub. No.: WO2021/217820
PCT Pub. Date: Nov. 4, 2021

(65) Prior Publication Data
US 2023/0112449 A1    Apr. 13, 2023

(30) Foreign Application Priority Data

Apr. 27, 2020   (CN) .......................... 202010344181.5

(51) Int. Cl.
*H10K 50/15*    (2023.01)
*H10K 50/84*    (2023.01)
(Continued)

(52) U.S. Cl.
CPC ........... *H10K 59/122* (2023.02); *H10K 50/15* (2023.02); *H10K 50/16* (2023.02); *H10K 50/844* (2023.02);
(Continued)

(58) Field of Classification Search
CPC ...... H10K 59/122; H10K 50/15; H10K 50/16; H10K 50/844; H10K 77/111; H10K 50/8426
See application file for complete search history.

(56) References Cited

U.S. PATENT DOCUMENTS 10,916,723 B2 *   2/2021   Lee ..................... H10K 50/16
10,971,551 B2 *   4/2021   Wang ................... H10K 50/81
(Continued)

FOREIGN PATENT DOCUMENTS

CN    109103218 A    12/2018
CN    109461825 A    3/2019
(Continued)

*Primary Examiner* — Ida M Soward
(74) *Attorney, Agent, or Firm* — Nathan & Associates; Menachem Nathan

(57) ABSTRACT

A display panel and a display device are provided. The display panel includes an array substrate, a first electrode, a pixel defining block, an organic common layer, a second electrode, an adhesive layer, and a thin film encapsulation layer. The organic common layer corresponding to the pixel defining block is defined with a through hole, and the adhesive layer is filled, which realizes a strong adhesion between the second electrode and the pixel defining block, and reduces a risk of peeling between layers of the organic common layer.

18 Claims, 3 Drawing Sheets

(51) Int. Cl.
*H10K 59/12* (2023.01)
*H10K 59/17* (2023.01)
*H10K 59/122* (2023.01)
*H10K 50/16* (2023.01)
*H10K 77/10* (2023.01)
*H10K 50/844* (2023.01)
*H10K 50/842* (2023.01)

(52) U.S. Cl.
CPC ........ *H10K 77/111* (2023.02); *H10K 50/8426* (2023.02)

(56) References Cited

U.S. PATENT DOCUMENTS

| | | | |
|---|---|---|---|
| 2013/0234126 A1* | 9/2013 | Nakatani | H10K 59/122 438/34 |
| 2014/0097418 A1* | 4/2014 | Kim | H10K 50/844 257/40 |
| 2014/0159064 A1* | 6/2014 | Sakariya | H01L 25/167 257/88 |
| 2015/0144917 A1* | 5/2015 | Koo | H10K 50/8426 257/40 |
| 2015/0171327 A1* | 6/2015 | Matsushima | H10K 59/353 438/35 |
| 2015/0179718 A1* | 6/2015 | Kim | H10K 50/824 438/34 |
| 2016/0064461 A1* | 3/2016 | Lee | H10K 59/122 257/40 |
| 2017/0005000 A1 | 1/2017 | Beyne | |
| 2017/0110683 A1* | 4/2017 | Koresawa | G02B 5/201 |
| 2018/0151646 A1* | 5/2018 | Kim | H10K 77/111 |
| 2018/0342563 A1* | 11/2018 | You | H10K 71/00 |
| 2018/0342691 A1* | 11/2018 | Lu | H01L 33/0095 |
| 2019/0189717 A1* | 6/2019 | Choi | H10K 59/38 |
| 2019/0326548 A1* | 10/2019 | Li | H10K 59/122 |
| 2020/0259113 A1* | 8/2020 | Takahashi | H10K 50/11 |
| 2021/0335914 A1* | 10/2021 | Du | H10K 50/82 |

FOREIGN PATENT DOCUMENTS

| | | | | |
|---|---|---|---|---|
| CN | 208622775 U | * | 3/2019 | |
| CN | 208622775 U | | 3/2019 | |
| CN | 109817822 A | | 5/2019 | |
| CN | 208819885 U | | 5/2019 | |
| CN | 109904341 A | | 6/2019 | |
| CN | 111403449 A | | 7/2020 | |
| EP | 2184795 A1 | * | 5/2010 | ......... H01L 51/5246 |
| JP | 2005038651 A | * | 2/2005 | |
| KR | 100658758 B1 | * | 12/2006 | ............ H10K 71/00 |

* cited by examiner

DISPLAY PANEL AND DISPLAY DEVICE INCLUDING ADHESIVE THROUGH HOLE CONNECTING CATHODE AND PIXEL DEFINING BLOCK

TECHNICAL FIELD

The present disclosure relates to the field of display technology, and in particular, to a display panel and a display device.

BACKGROUND

Organic light-emitting diodes (OLEDs), as a kind of current-type light-emitting device characterized by low power consumption and bendability, are very suitable for wearable display devices and have been increasingly applied in high-performance displays. Flexible OLED screens have obvious advantages over liquid crystal displays (LCDs) due to their self-luminous properties. They are thinner and lighter in size and consume less power than existing devices, which helps to improve battery life of devices. Meanwhile, based on their characteristics of good bendability and flexibility, their durability is also much better than previous screens, and can reduce accidental damage of display devices.

Although flexible OLED displays have a very broad application prospect, there are many problems in various manufacturing processes and dynamic folding processes of OLED products at present. Among them, the most prominent problem is that OLED products have different degrees of peeling of layers; that is, in manufacturing processes or in dynamic folding processes, as shown in FIG. 1, a peeling phenomenon occurs between some layers (or within the layers, as shown in FIG. 2). Currently, an internal structure of an OLED panel mainly comprises an encapsulation layer and a light-emitting layer. The structure is generally composed of multiple layers, so when adhesion (binding forces) of a part of the layers is weak, the peeling of layers may occur. When the peeling of layers has occurred, functions of OLED devices fail, which seriously affects a product yield. Therefore, it is very necessary to solve the problem of the peeling of OLED layers.

Combined with current test results, it is found that the peeling phenomenon mainly occurs inside functional layers (between upper and lower electrodes). This is because organic materials inside OLEDs constitute functional films, and binding forces inside these materials and adhesion between these materials and other layers are small, so it is easy to generate the peeling phenomenon. There are two main reasons for the peeling phenomenon: intermediate peeling due to small adhesion between two layers and adhesive peeling due to small internal adhesion inside some materials. At present, the main solution to the intermediate peeling is to add an intermediate layer between the two layers to make the adhesion between the intermediate layer and upper and lower layers greater. That is, a layer of "double-sided tape" is added between the two layers to hold them together. Alternatively, activation treatment, such as plasma treatment, can be carried out on the interface of the two layers to form additional functional keys. The plasma treatment on the interface can improve the interface adhesion to a certain extent, but it cannot solve the problem of the intermediate peeling effectively. Currently, the problem of the adhesive peeling can only be solved by replacing with materials with a greater internal binding force. However, for OLEDs, selected organic functional materials need to be considered with its work function, so there are few materials that meet the requirements. Therefore, it is not possible to improve the internal binding force through simple material replacement, which results in a mismatch of work functions, or even failure to emit light. Moreover, the small internal binding force is a common feature of organic materials in OLEDs, and it is difficult to improve the peeling phenomenon of layers through the above methods.

Therefore, it is necessary to provide a display panel and a display device to solve the problem of the peeling of layers.

SUMMARY

It is necessary for the present disclosure to provide a display panel and a display device to solve the problem of peeling of layers.

An embodiment of the present disclosure provides a display panel comprising: an array substrate; a first electrode arranged on the array substrate; a pixel defining block arranged on the array substrate and surrounding the first electrode; an organic common layer arranged on the first electrode and the pixel defining block and defined with a through hole, wherein the through hole extends through the organic common layer and a portion of the pixel defining block; a second electrode arranged on the organic common layer; and an adhesive layer arranged in the through hole and connected between the second electrode and the pixel defining block.

Furthermore, a material of the adhesive layer comprises an organic material, and the organic material comprises acrylic.

Furthermore, a material of the adhesive layer and a material of the second electrode are same, and the adhesive layer and the second electrode are manufactured in a same step.

Furthermore, the organic common layer comprises: a hole transporting layer arranged on the first electrode and the pixel defining block; a light-emitting layer arranged on the hole transporting layer and corresponding to the first electrode; and an electron transporting layer arranged on the light-emitting layer and a portion of the hole transporting layer.

Furthermore, the through hole is defined corresponding to the pixel defining block and extends through the electron transporting layer, the hole transporting layer, and the portion of the pixel defining block.

Furthermore, the display panel comprises a thin film encapsulation layer arranged on the second electrode.

Furthermore, the thin film encapsulation layer comprises: a first inorganic layer; an organic layer arranged at a side of the first inorganic layer; and a second inorganic layer arranged at a side of the organic layer away from the first inorganic layer.

Furthermore, the array substrate comprises: a flexible substrate; and a thin film transistor layer arranged on the flexible substrate, wherein the thin film transistor layer comprises a thin film transistor corresponding to the first electrode, and the first electrode is connected to the thin film transistor.

Furthermore, the thin film transistor is a metal oxide thin film transistor or a low temperature poly-silicon thin film transistor.

An embodiment of the present disclosure provides a display device comprising the above display panel.

In the display panel and the display device provided in the embodiments of the present disclosure, the organic common layer corresponding to the pixel defining block is defined with a through hole, and the adhesive layer is filled, which realizes a strong adhesion between the second electrode and the pixel defining block, and reduces a risk of peeling between layers of the organic common layer. In addition, a material of the adhesive layer and a material of the second electrode are same, and the adhesive layer and the second electrode are manufactured in a same step. That is, when the second electrode is formed by evaporation after the through hole is defined, a material of the second electrode is directly evaporated into the through hole and connected with the pixel defining block.

BRIEF DESCRIPTION OF DRAWINGS

To describe the technical solutions of the embodiments of the present disclosure more clearly, the following briefly introduces the accompanying drawings used in the description of the embodiments of the present disclosure. Apparently, the accompanying drawings described below illustrate only some exemplary embodiments of the present disclosure, and persons skilled in the art may derive other drawings from the drawings without making creative efforts.

Figure 1:
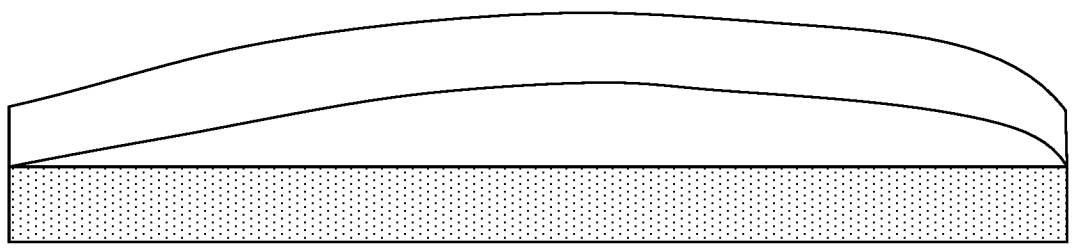
FIG. 1 is a schematic structural diagram illustrating peeling off between different layers in prior art.
Figure 2:
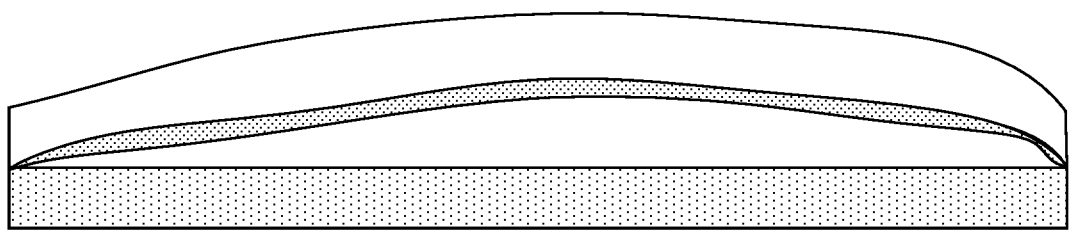
FIG. 2 is a schematic structural diagram illustrating intermediate peeling in a same layer in prior art.

Reference marks are: display panel 100, array substrate 10, first electrode 103, pixel defining block 104, organic common layer 105, second electrode 106, adhesive layer 108, thin film encapsulation layer 107, flexible substrate 101, thin film transistor layer 102, hole transporting layer 105, light-emitting layer 1052, electron transporting layer 1053, through hole 109, first inorganic layer 1071, organic layer 1072, and second inorganic layer 1073.

DETAILED DESCRIPTION OF PREFERRED EMBODIMENTS

The following description of every embodiment with reference to the accompanying drawings is used to exemplify a specific embodiment which may be carried out in the present disclosure. Directional terms mentioned in the present disclosure, such as "top", "bottom", "front", "back", "left", "right", "inside", "outside", "side" etc., are only used with reference to the orientation of the accompanying drawings. The component names mentioned in the present disclosure, such as first and second, are only used to distinguish different components for better expression. In the accompanying drawings, units with similar structures are indicated by a same number.

Embodiments of the present disclosure will be described in detail with reference to the accompanying drawings. The present disclosure can be embodied in many different forms and should not be interpreted only as a specific embodiment described herein. These embodiments are provided for explaining actual applications of the present disclosure, and thus those skilled in the art can understand various embodiments and modifications which are suitable for specific intended applications of the present disclosure.

Figure 3:
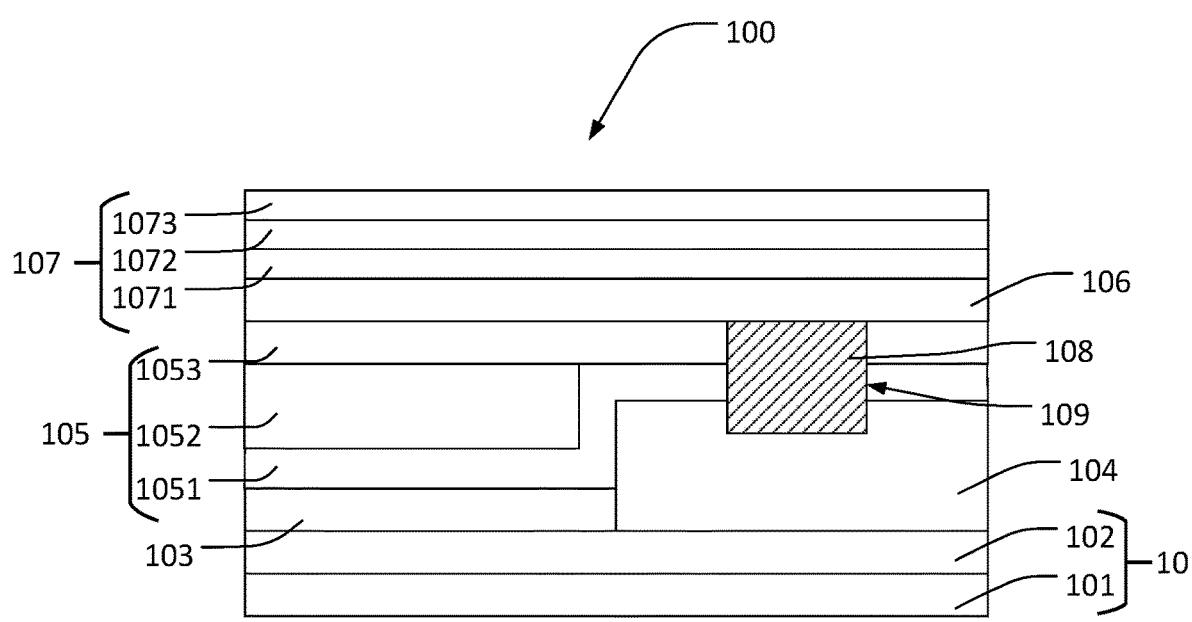
FIG. 3 is a schematic structural diagram illustrating a display panel according to an embodiment of the present disclosure.

As shown in FIG. 3, an embodiment of the present disclosure provides a display panel 100 comprising an array substrate 10, a first electrode 103, a pixel defining block 104, an organic common layer 105, a second electrode 106, an adhesive layer 108, and a thin film encapsulation layer 107.

The array substrate 10 comprises a flexible substrate 101 and a thin film transistor layer 102.

A material of the flexible substrate 101 comprises polyimide.

The thin film transistor layer 102 is arranged on the flexible substrate 101, wherein the thin film transistor layer 102 comprises a thin film transistor corresponding to the first electrode 103, and the first electrode 103 is connected to the thin film transistor.

The thin film transistor is a metal oxide thin film transistor or a low temperature poly-silicon thin film transistor.

The first electrode 103 is arranged on the array substrate 10, and the first electrode 103 is connected to a source electrode or a drain electrode of the thin film transistor.

The pixel defining block 104 is arranged on the array substrate 10 and surrounds the first electrode 103, and the pixel defining block 104 is used to define a light-emitting area of the display panel 100.

The organic common layer 105 is arranged on the first electrode 103 and the pixel defining block 104, and is defined with a through hole 109, wherein the through hole 109 extends through the organic common layer 105 and a portion of the pixel defining block 104.

The organic common layer 105 comprises a hole transporting layer 1051, a light-emitting layer 1052, and an electron transporting layer 1053. The hole transporting layer 1051 is arranged on the first electrode 103 and the pixel defining block 104. The light-emitting layer 1052 is arranged on the hole transporting layer 1051 and corresponding to the first electrode 103. The electron transporting layer 1053 is arranged on the light-emitting layer 1052 and a portion of the hole transporting layer 1051.

The through hole 109 is corresponding to the pixel defining block 104, and the through hole 109 extends through the electron transporting layer 1053, the hole transporting layer 1051, and the portion of the pixel defining block 104.

The second electrode 106 is arranged on the organic common layer 105.

The adhesive layer 108 is arranged in the through hole 109 and connected between the second electrode 106 and the pixel defining block 104. A material of the adhesive layer 108 comprises an organic material, and the organic material comprises acrylic.

The thin film encapsulation layer 107 is arranged on the second electrode 106.

The thin film encapsulation layer 107 comprises a first inorganic layer 1071, an organic layer 1072, and a second inorganic layer 1073.

The first inorganic layer 1071 is formed by chemical vapor deposition.

The organic layer 1072 is arranged at a side of the first inorganic layer 1071, and the organic layer 1072 is formed by ink-jet printing.

The second inorganic layer 1073 is arranged at a side of the organic layer 1072 away from the first inorganic layer 1071, and the second inorganic layer 1073 is formed by chemical vapor deposition.

In the display panel 100 provided in the embodiment of the present disclosure, the organic common layer corresponding to the pixel defining block 104 is defined with a through hole, and the adhesive layer 108 is filled, which realizes a strong adhesion between the second electrode 106 and the pixel defining block 104, and reduces a risk of peeling between layers of the organic common layer.

Figure 4:
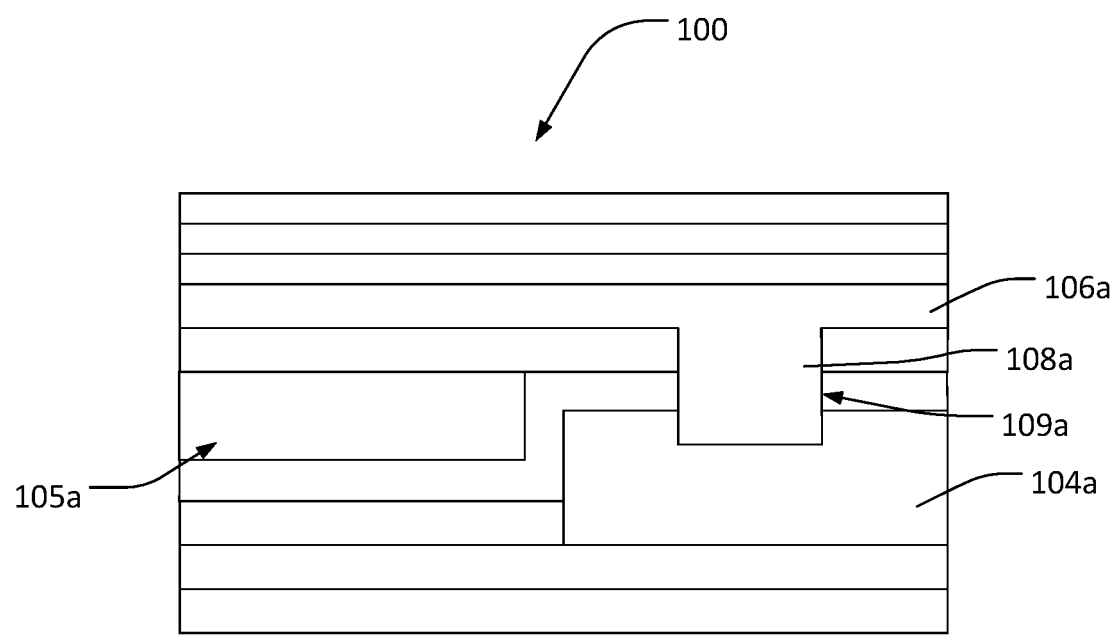
FIG. 4 is a schematic structural diagram illustrating a display panel according to another embodiment of the present disclosure.

As shown in FIG. 4, another embodiment of the present disclosure provides a display panel 100a. Differing from the above embodiment, a material of the adhesive layer 108a and a material of the second electrode 106a are same, and the adhesive layer 108a and the second electrode 106a are manufactured in a same step.

No additional manufacturing steps are required in the second embodiment compared with the first embodiment. That is, when the second electrode 106a is formed by evaporation after the through hole 109a is defined, a material of the second electrode 106a is directly evaporated into the through hole 109a and connected with the pixel defining block 104a, which realizes a strong adhesion between the second electrode 106a and the pixel defining block 104a, and reduces a risk of peeling between layers of the organic common layer 105a.

An embodiment of the present disclosure provides a display device comprising the display panel 100 provided in the first embodiment or the display panel 100a provided in the second embodiment.

The display device can realize a strong adhesion between the second electrode 106 and the pixel defining block 104, and reduce a risk of peeling between layers of the organic common layer.

In the foregoing embodiments, the descriptions of the embodiments have their respective focuses. For a part that is not described in detail in an embodiment, reference may be made to related descriptions in other embodiments.

The technical scope of the present disclosure is not limited to the contents recited in the descriptions. A person of ordinary skill in the art may further make various variations and modifications without departing from the concept of the present disclosure, and the variations and improvements belong to the protection scope of the present disclosure.

What is claimed is:

1. A display panel, comprising:
   an array substrate;
   a first electrode arranged on the array substrate;
   a pixel defining block arranged on the array substrate and surrounding the first electrode;
   an organic common layer arranged on the first electrode and the pixel defining block and defined with a through hole, wherein the through hole extends through the organic common layer and a portion of the pixel defining block;
   a second electrode arranged on the organic common layer; and
   an adhesive layer arranged in the through hole and connected between the second electrode and the pixel defining block.

2. The display panel as claimed in claim 1, wherein a material of the adhesive layer comprises an organic material, and the organic material comprises acrylic.

3. The display panel as claimed in claim 1, wherein a material of the adhesive layer and a material of the second electrode are same, and the adhesive layer and the second electrode are manufactured in a same step.

4. The display panel as claimed in claim 1, wherein the organic common layer comprises:
   a hole transporting layer arranged on the first electrode and the pixel defining block;
   a light emitting layer arranged on the hole transporting layer and corresponding to the first electrode; and
   an electron transporting layer arranged on the light emitting layer and a portion of the hole transporting layer.

5. The display panel as claimed in claim 4, wherein the through hole is defined corresponding to the pixel defining block and extends through the electron transporting layer, the hole transporting layer, and the portion of the pixel defining block.

6. The display panel as claimed in claim 1, further comprising a thin film encapsulation layer arranged on the second electrode.

7. The display panel as claimed in claim 6, wherein the thin film encapsulation layer comprises:
   a first inorganic layer;
   an organic layer arranged at a side of the first inorganic layer; and
   a second inorganic layer arranged at a side of the organic layer away from the first inorganic layer.

8. The display panel as claimed in claim 1, wherein the array substrate comprises:
   a flexible substrate; and
   a thin film transistor layer arranged on the flexible substrate, wherein the thin film transistor layer comprises a thin film transistor corresponding to the first electrode, and the first electrode is connected to the thin film transistor.

9. The display panel as claimed in claim 8, wherein the thin film transistor is a metal oxide thin film transistor or a low temperature poly-silicon thin film transistor.

10. A display device, comprising a display panel, wherein the display panel comprises:
    an array substrate;
    a first electrode arranged on the array substrate;
    a pixel defining block arranged on the array substrate and surrounding the first electrode;
    an organic common layer arranged on the first electrode and the pixel defining block and defined with a through hole, wherein the through hole extends through the organic common layer and a portion of the pixel defining block;
    a second electrode arranged on the organic common layer; and
    an adhesive layer arranged in the through hole and connected between the second electrode and the pixel defining block.

11. The display device as claimed in claim 10, wherein a material of the adhesive layer comprises an organic material, and the organic material comprises acrylic.

12. The display device as claimed in claim 10, wherein a material of the adhesive layer and a material of the second electrode are same, and the adhesive layer and the second electrode are manufactured in a same step.

13. The display device as claimed in claim 10, wherein the organic common layer comprises:
    a hole transporting layer arranged on the first electrode and the pixel defining block;
    a light emitting layer arranged on the hole transporting layer and corresponding to the first electrode; and
    an electron transporting layer arranged on the light emitting layer and a portion of the hole transporting layer.

14. The display device as claimed in claim 13, wherein the through hole is defined corresponding to the pixel defining block and extends through the electron transporting layer, the hole transporting layer, and the portion of the pixel defining block.

15. The display device as claimed in claim 10, further comprising a thin film encapsulation layer arranged on the second electrode.

16. The display device as claimed in claim 15, wherein the thin film encapsulation layer comprises:
- a first inorganic layer;
- an organic layer arranged at a side of the first inorganic layer; and
- a second inorganic layer arranged at a side of the organic layer away from the first inorganic layer.

17. The display device as claimed in claim 10, wherein the array substrate comprises:
- a flexible substrate; and
- a thin film transistor layer arranged on the flexible substrate, wherein the thin film transistor layer comprises a thin film transistor corresponding to the first electrode, and the first electrode is connected to the thin film transistor.

18. The display device as claimed in claim 17, wherein the thin film transistor is a metal oxide thin film transistor or a low temperature poly-silicon thin film transistor.

* * * * *